US012595590B2

(12) United States Patent
Yu et al.

(10) Patent No.: US 12,595,590 B2
(45) Date of Patent: Apr. 7, 2026

(54) PIEZOELECTRIC SINGLE CRYSTAL M₃RE(PO₄)₃ AND THE PREPARATION METHOD AND APPLICATION THEREOF

(71) Applicant: SHANDONG UNIVERSITY, Jinan (CN)

(72) Inventors: Fapeng Yu, Jinan (CN); Guangda Wu, Jinan (CN); Mengdi Fan, Jinan (CN); Yanlu Li, Jinan (CN); Xiufeng Cheng, Jinan (CN); Xian Zhao, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 635 days.

(21) Appl. No.: 17/595,832

(22) PCT Filed: Jun. 10, 2020

(86) PCT No.: PCT/CN2020/095244
§ 371 (c)(1),
(2) Date: Nov. 24, 2021

(87) PCT Pub. No.: WO2020/248987
PCT Pub. Date: Dec. 17, 2020

(65) Prior Publication Data
US 2022/0228294 A1     Jul. 21, 2022

(30) Foreign Application Priority Data

Jun. 14, 2019   (CN) .......................... 201910517507.7
Jun. 14, 2019   (CN) .......................... 201910517509.6

(51) Int. Cl.
*C30B 29/14*        (2006.01)
*C30B 15/10*        (2006.01)
(Continued)

(52) U.S. Cl.
CPC .............. *C30B 29/14* (2013.01); *C30B 15/10* (2013.01); *C30B 15/14* (2013.01); *C30B 15/36* (2013.01)

(58) Field of Classification Search
CPC ......... C30B 15/00; C30B 15/10; C30B 15/14; C30B 15/36; C30B 29/14; G02F 1/355; H01S 3/16
See application file for complete search history.

(56) References Cited

PUBLICATIONS

Seo et al, "Tunable single-phased white-emitting Sr3Y(PO4)3:Dy3+ phosphors for near-ultraviolet white light-emitting diodes", Ceramics International, vol. 43, Issue 11,pp. 8497-8501, (Year: 2017).*
(Continued)

*Primary Examiner* — Matthew J Song
(74) *Attorney, Agent, or Firm* — CBM PATENT CONSULTING, LLC

(57)           ABSTRACT

A crystal is of a non-centrosymmetric structure and belongs to the −43 m point group of the cubic crystal system. M denotes an alkaline earth metal, which can be Ba, Ca, or Sr, and RE denotes a rare earth element, which can be Y, La, Gd, or Yb. The growth method of the M₃RE(PO₄)₃ crystal comprises steps as follows: (1) polycrystalline material synthesis: MCO₃, RE₂O₃, and phosphorous compound are used as raw materials and blended according to the stoichiometric proportions; then, the phosphorous compound is further added to be excessive; the raw materials are sintered twice to obtain the M₃RE(PO₄)₃ polycrystalline material; (2) polycrystalline material melting; (3) Czochralski crystal growth. The M₃RE(PO₄)₃ crystal prepared by the invention is a high-quality single crystal.

7 Claims, 11 Drawing Sheets

(51) Int. Cl.
    *C30B 15/14*        (2006.01)
    *C30B 15/36*        (2006.01)

(56)                References Cited

PUBLICATIONS

Chen et al, "Optical spectroscopic investigation of Ba3Tb(PO4)3 single crystals for visible laser applications," Optical Materials 44 , p. 48-53 (Year: 2015).*

Zhang et al, "Sr3La(PO4)3:Eu2+, Mn2+: single-phased color-tunable phosphor and its energy transfer behavior," Journal of Luminescence, 157, p. 352-356. (Year: 2015).*

Gou et al, "Color tuning and energy transfer in Eu2+/Mn2+-doped Ba3Y(PO4)3 eulytite-type orthophosphate phosphors", RSC Adv. , 2015, 5, 46517-46524 (Year: 2015).*

Li et al, "Photoluminescence and Energy Transfer Properties with Y+SiO4 Substituting Ba+PO4 in Ba3Y(PO4)3:Ce3+/Tb3+, Tb3+/Eu3+ Phosphors for w-LEDs," Inorg. Chem. 2016, 55, 7593-7604 (Year: 2016).*

* cited by examiner

PIEZOELECTRIC SINGLE CRYSTAL M₃RE(PO₄)₃ AND THE PREPARATION METHOD AND APPLICATION THEREOF

FIELD OF THE INVENTION

The invention relates to a piezoelectric single crystal $M_3RE(PO_4)_3$ and the preparation method and application thereof and pertains to the field of photoelectric functional crystals.

BACKGROUND OF THE INVENTION

Photoelectric functional crystal materials are valued by the world because they are critical materials in various high-tech fields, including microelectronics, optoelectronics, communication, aerospace, and modern military technology. The development of laser and optoelectronics has further pushed the development and application of functional crystals. China walks at the forefront of the world in the research and application of photoelectric functional crystals and, particularly in inorganic nonlinear optical crystals. Nonetheless, the world is now competing increasingly fiercely in the field of photoelectric functional crystals. Researchers on crystal materials in China are still making continuous efforts to develop new crystal materials.

Photoelectric functional crystals are abundant in varieties. Depending on functions, they consist of nonlinear optical crystals, piezoelectric crystals, laser crystals, and scintillation crystals mainly. As there are limited photoelectric functional crystal materials available, it is an urgent need to explore novel functional crystal materials in order to develop new photoelectric devices and expand new applications. Existing researches on compounds with the $M_3RE$ $(PO_4)_3$-type structure focus on the synthesis and the luminescence properties of the rare earth ions doped Nano-phosphors. For example, in 2008, Xu Shuai et al. from Tongji University developed the $Eu^{3+}$, $Tb^{3+}$, and $Ce^{3+}$ ions doped $Sr_3Y(PO_4)_3$ phosphors with the solution-gel method. (See Journal of Optoelectronics and Advanced Materials Vol. 10, No 10, October 2008, p 2727-2731) For another example, concerning the synthesis of phosphors, Guo Ning et al. from Changchun Institute of Applied Chemistry created the cubic eulytine-type $Ba_3Gd(PO_4)_3$ phosphors with the high-temperature solid-state method and studied the luminescence properties after $Eu^{2+}$ and $Mn^{2+}$ doping in 2013. (See Chem Phys Chem 2013, 14, 192-197). Although some $M_3RE(PO_4)_3$-type compound phosphors have been prepared, few reports are available on single crystals with the $M_3RE(PO_4)_3$-type structure, as well as their growth technics.

For now, no studies on $Sr_3Y(PO_4)_3$ crystals have been reported. The few studies involving $Sr_3Y(PO_4)_3$ are limited to $Sr_3Y(PO_4)_3$ Nano-phosphors doped with different rare-earth ions. In terms of the synthesis of $Sr_3Y(PO_4)_3$ phosphors, Xu Shuai et al. from Tongji University developed the $Eu^{3+}$, $Tb^{3+}$, and $Ce^{3+}$ ions doped $Sr_3Y(PO_4)_3$ phosphors with the solution-gel method in 2008. However, the study focused on the luminescence properties of the Nano phosphors doped with rare-earth ions and did not involve the growth, photoelectric properties, and applications of the single crystal. (See Journal of Optoelectronics and Advanced Materials Vol. 10, No 10, October 2008, p 2727-2731) Hence, the applicant has proposed this invention to develop a novel piezoelectric single crystal.

CONTENT OF THE INVENTION

To address the drawbacks in the prior art, the invention provides a piezoelectric single crystal with the general formula of $M_3RE(PO_4)_3$ and the preparation method thereof.

The invention also provides a $Sr_3Y(PO_4)_3$ single crystal.

The invention also provides the application of the said $Sr_3Y(PO_4)_3$ single crystal.

Definition of Terms

Yttrium strontium phosphate single crystal: chemical formula: $Sr_3Y(PO_4)_3$. Its idiomatic expression in the technical field is abbreviated as SYP or $Sr_3Y(PO_4)_3$, both of which have the same meaning in the invention.

Room temperature: It has the meaning of public knowledge in this field and generally refers to $25\pm5°$ C.

Extracting crystal: It means pulling the crystal away from the melt level.

SUMMARY OF THE INVENTION

The invention applies for the first time the Czochralski method to grow the piezoelectric single crystal $M_3RE(PO_4)_3$ having the non-centrosymmetric structure. The $M_3RE$ $(PO_4)_3$ crystal belongs to the −43m point group of the cubic crystal system. It features high optical transmittance and wide absorption edges, as well as no phase transition from room temperature to the melting point. Due to the piezoelectric activity and nonlinear frequency conversion properties, it has broad application prospects in the field of photoelectric functional devices.

DETAILED DESCRIPTION OF THE INVENTION

A technical solution of the present invention is provided below:

A piezoelectric single crystal with the general formula of $M_3RE(PO_4)_3$, where M denotes an alkaline earth metal and RE denotes a rare earth element. The said single crystal is of a non-centrosymmetric structure and belongs to the −43m point group of the cubic crystal system.

Preferably according to the invention, the said alkaline earth metal is Ba, Ca, or Sr.

Preferably according to the invention, the said rare earth element is Y, La, Gd, or Yb.

The rare earth element in the invention is not limited to Y, La, Gd, or Yb. Other rare earth elements also apply, and the features, including good mechanical properties, difficulty in deliquescence, and congruent melting, won't change. Due to the non-centrosymmetric structure, the single crystal is suitable to be used as nonlinear optical crystal or piezoelectric crystal. It has a variety of advantages when applied as nonlinear optical crystal or piezoelectric crystal, including high melting point, no phase transition from room temperature to the melting point, stable chemical properties, and difficulty in deliquescence. Also, as a compound with both a high melting point and a non-centrosymmetric structure, it has obvious advantages in high-temperature piezoelectric and wide-temperature nonlinear optical fields.

Preferably, the $M_3RE(PO_4)_3$ piezoelectric single crystal is one from the following:

$Ba_3Y(PO_4)_3$ single crystal, $Ba_3La(PO_4)_3$ single crystal, $Ba_3Yb(PO_4)_3$ single crystal, $Ca_3Gd(PO_4)_3$ single crystal, $Sr_3Y(PO_4)_3$ single crystal, $Sr_3La(PO_4)_3$ single crystal, and $Sr_3Gd(PO_4)_3$ single crystal; the corresponding chemical names are yttrium barium phosphate single crystal, lanthanum barium phosphate single crystal, ytterbium barium phosphate single crystal, gadolinium calcium phosphate single crystal, yttrium strontium phosphate single crystal, lanthanum strontium phosphate single crystal, and gadolinium strontium phosphate single crystal respectively.

More preferably, the structure parameters of the above crystals are as follows:

$Ba_3Y(PO_4)_3$ single crystal: the −43m point group of the cubic crystal system; I-43d space group; lattice parameters: a=b=c=10.4655 Å; density=4.553 g/cm³;

$Ba_3La(PO_4)_3$ single crystal: the −43m point group of the cubic crystal system; I-43d space group; lattice parameters: a=b=c=10.521 Å; density=4.77 g/cm³;

$Ba_3Yb(PO_4)_3$ single crystal: the −43m point group of the cubic crystal system; I-43d space group; lattice parameters: a=b=c=10.459 Å; density=5.149 g/cm³;

$Ca_3Gd(PO_4)_3$ single crystal: the −43m point group of the cubic crystal system; I-43d space group; lattice parameters: a=b=c=9.857 Å; density=3.9 g/cm³;

$Sr_3Y(PO_4)_3$ single crystal: the −43m point group of the cubic crystal system; I-43d space group; lattice parameters: a=b=c=10.0814 Å; density=4.093 g/cm³;

$Sr_3La(PO_4)_3$ single crystal: the −43m point group of the cubic crystal system; I-43d space group; lattice parameters: a=b=c=10.192 Å; density=4.3 g/cm³;

$Sr_3Gd(PO_4)_3$ single crystal: the −43m point group of the cubic crystal system; I-43d space group; lattice parameters: a=b=c=10.114 Å; density=4.526 g/cm³.

According to the invention, upon spectral analysis of the said $M_3RE(PO_4)_3$ piezoelectric single crystal, the $Ba_3Y$ $(PO_4)_3$ single crystal, $Ba_3La(PO_4)_3$ single crystal, $Ca_3Gd$ $(PO_4)_3$ single crystal, $Sr_3La(PO_4)_3$ single crystal, and $Sr_3Gd$ $(PO_4)_3$ single crystal all have high optical transmittance of >70% in the 325 nm-4302 nm band.

According to the invention, upon measurement of the said $M_3RE(PO_4)_3$ piezoelectric single crystal with the impedance method, the $Ba_3Y(PO_4)_3$ single crystal, $Ba_3La(PO_4)_3$ single crystal, $Ba_3Yb(PO_4)_3$ single crystal, $Ca_3Gd(PO_4)_3$ single crystal, $Sr_3La(PO_4)_3$ single crystal, and $Sr_3Gd(PO_4)_3$ single crystal all have an effective piezoelectric constant $d_{eff}$>6 pC/N, indicating that they have piezoelectric activity.

A yttrium strontium phosphate single crystal with the chemical formula of $Sr_3Y(PO_4)_3$, which is of a non-centrosymmetric structure, belongs to the −43m point group of the cubic crystal system, and with lattice parameters: a=10.0814 Å, b=10.0814 Å, c=10.0814 Å, α=β=γ=90°. It has no phase transition from room temperature to the melting point.

Preferably, the melting point of the said yttrium strontium phosphate single crystal is basically at 1850° C., and the single crystal has no phase transition from room temperature to the melting point.

More preferably, upon spectral analysis, the said yttrium strontium phosphate single crystal has high optical transmittance of >80% in the 480 nm-4100 nm band.

More preferably, upon measurement with the impedance method, the said yttrium strontium phosphate single crystal has an effective piezoelectric constant $d_{14}$=6-10pC/N.

More preferably, upon measurement and calculation with the impedance method, the said yttrium strontium phosphate crystal has an effective electromechanical coupling factor $k_{14}$=10-30%.

A growth method of the $M_3RE(PO_4)_3$ piezoelectric single crystal in the invention, comprising steps as follows:

a. Polycrystalline Material Synthesis

The raw materials $MCO_3$, $RE_2O_3$, and phosphorous compound are accurately weighed by stoichiometric proportions according to the general formula $M_3RE(PO_4)_3$. The phosphorous compound is further added to exceed the mass percent (based on the stoichiometric proportion of the phosphorus compound in the formula) by 1.5-10%.

The well-weighed raw materials are ground and mixed evenly for the first sintering (the sintering is preferred to be conducted in a ceramic crucible); the sintering temperature is maintained at 800° C.-950° C. and constant for 10 to 15 hours; after the first sintering, the raw materials are cooled down, ground, and evenly mixed; then, they are pressed into round cake-like blocks for the second sintering; the sintering temperature is maintained at 1200-1400° C. and constant for 20 to 40 hours; finally, the $M_3RE(PO_4)_3$ polycrystalline material is obtained through the solid-state reaction.

(2) Polycrystalline Material Melting

The $M_3RE(PO_4)_3$ polycrystalline material synthesized in step (1) is placed in the iridium crucible of a single crystal growing furnace; before that, the furnace has been evacuated and filled with protective gas nitrogen or argon; the polycrystalline material is heated up with the medium-frequency induction heating method till melting; it is cooled down to coagulate after melting thoroughly and then heated up again to fully melt; this process is repeated several times to drain the bubbles from the melt; then, the melt is overheated 10-20° C. for 0.5-2 hours to obtain the homogeneously melted $M_3RE(PO_4)_3$ melt.

(3) Czochralski Crystal Growth

An iridium rod or an $M_3RE(PO_4)_3$ crystal is used as the seed crystal and lowered to the melt level of the $M_3RE$ $(PO_4)_3$ to have the bottom perpendicular to and just in contact with the melt for single crystal growth. The technological conditions of the single crystal growth are as follows: growth temperature: 1800-1950° C.; pulling rate during necking of the seed crystal: 1-5 mm/h; pulling rate during shouldering: 0.2-1 mm/h; pulling rate while performing constant diameter growth: 0.5-1 mm/h. The crystal is then extracted after growing to the desired size.

Preferably, after extracting, the crystal is maintained at a constant temperature for 0.5-1 h in the thermal field and then cooled down at the rate of 5-30° C./h to room temperature to obtain the $M_3RE(PO_4)_3$ crystal.

More preferably, after being taken out from the single crystal growing furnace, the $M_3RE(PO_4)_3$ crystal is annealed at 1200-1400° C. The time of annealing is preferred to be 24-48 hours so that the thermal stress generated during the growth of the $M_3RE(PO_4)_3$ piezoelectric single crystal can be fully released. Preferably, the $M_3RE(PO_4)_3$ piezoelectric single crystal is annealed in a high-temperature muffle furnace.

Preferably according to the invention, in step (1), the said phosphorous compound is $NH_4H_2PO_4$ or $P_2O_5$. More preferably, the total mass of the phosphorus compound is to exceed its mass percent by 3-6%. The said raw materials in step (1) of the invention all use high-purity ingredients with a purity of greater than 99.9%, all of which can be purchased through conventional means.

Preferably according to the invention, in step (1), the said first sintering and second sintering of the raw materials are performed in a ceramic crucible. Among them, the first sintering aims to decompose and remove $CO_2$, $NH_3$, and $H_2O$ and improve the purity of the synthesized polycrystalline material.

The present invention uses the melt and the Czochralski method to grow the single crystal. When an iridium crucible is used, to prevent iridium from oxidizing at high temperatures, the crystal is grown in an inert atmosphere of nitrogen or argon. In particular, the volume fraction of the nitrogen or inert gases is 90-95%.

According to the invention, in step (2), the polycrystalline material repeats cooling coagulation and high-temperature melting several times after it is melted to drain the bubbles generated in the melt, to reduce the crystal growth defect (bubble and inclusion, etc.), and to improve the growth quality. Preferably, the said cooling coagulation and high-temperature melting process is repeated three to four times.

Preferably according to the invention, in step (3), the crystal growth undergoes four stages: necking, shouldering, performing constant diameter growth, and extracting crystal. During the necking stage, the pulling rate is controlled between 1 and 8 mm/h; after the diameter of the seed crystal is narrowed to 0.5-2.0 mm, the single crystal begins to be cooled down slowly at 0.5-5° C./h for shouldering. During the shouldering stage, the pulling rate is reduced to 0.2-1 mm/h. When the shoulder diameter reaches the desired size, the crystal is heated up or cooled down at the rate of 0-5° C./h and maintained at the temperature of 1800-1950° C. to perform constant diameter growth. After being pulled to the desired height, the crystal starts to be extracted.

More preferably, the technological conditions of extracting the crystal are as follows: the temperature is raised slowly at the rate of 10-50° C./h; when the bottom of the crystal has a tendency of inward shrinkage, the pulling rate is increased to 5-20 mm/h to pull the crystal away from the melt.

Preferably according to the invention, the single crystal can generally grow to a diameter of 15-30 mm and a height of 20-50 mm. The $M_3RE(PO_4)_3$ piezoelectric single crystal usually needs 4-7 days to grow to such a size. The said size of the crystal refers to the regular diameter and total height.

The said yttrium strontium phosphate single crystal in the invention uses the Czochralski method for crystal growth. The technical key of the method lies in the proportions of raw materials, especially the use of excessive phosphate raw material, and the synthesis of the polycrystalline material. Under appropriate temperatures and a specific thermal field, the method can produce a high optical quality single crystal that meets the needs of nonlinear optical and piezoelectric functional materials.

According to the invention, a preparation method of the yttrium strontium phosphate single crystal, comprising steps as follows:

The Sr-containing compound, Y-containing compound, and P-containing compound are mixed and sintered to obtain the yttrium strontium phosphate polycrystalline material; the polycrystalline material is heated up to melt and repeats the cooling coagulation and high-temperature melting process several times to obtain a homogeneously melted yttrium strontium phosphate melt;

According to the chemical formula $Sr_3Y(PO_4)_3$, based on the stoichiometric proportions of the said Sr-containing compound, Y-containing compound, and P-containing compound in the raw materials, the mass of the P-containing compound is added to exceed its mass percent by 2.5-7.5%.

An iridium rod or a yttrium strontium phosphate single crystal is used as the seed crystal. The bottom of the seed crystal is made just in contact with the melt level of the yttrium strontium phosphate for single crystal growth with the Czochralski method. The technological conditions of the single crystal growth are as follows: growth temperature: 1700-1850° C.; pulling rate during necking of the seed crystal: 2-5 mm/h; pulling rate during shouldering: 0.2-2 mm/h; pulling rate while performing constant diameter growth: 0.2-1 mm/h. The crystal is extracted after it grows to the desired size; after that, it is maintained at a constant temperature in the thermal field for 0.5-1 h and then cooled down at a rate of no more than 30° C./h to room temperature to obtain the yttrium strontium phosphate single crystal.

Preferably, the said Sr-containing compound, Y-containing compound, and P-containing compound are separately selected from at least one of the corresponding oxides, carbonates, phosphates, halides, nitrates, oxalates, and borates containing such elements, and they are not allowed to be halides at the same time.

More preferably, the Sr-containing compound is selected from the corresponding oxides, carbonates, halides, sulfates, or nitrates; the Y-containing compound is selected from the corresponding oxides, nitrates, or phosphates; the P-containing compound is selected from the corresponding oxides or phosphates. Most preferably, the Sr-containing compound, Y-containing compound, and P-containing compound are $SrCO_3$, $Y_2O_3$, and $NH_4H_2PO_4$ or $P_2O_5$ respectively.

More preferably, based on the stoichiometric proportions of the said Sr-containing compound, Y-containing compound, and P-containing compound in the raw materials, the mass of the P-containing compound exceeds its mass percent by 3-5%.

Preferably according to the invention, during the preparation of the yttrium strontium phosphate polycrystalline material, the raw materials are sintered twice at high temperatures after being mixed so as to guarantee the growth quality. The raw material mixing and sintering process is as follows: The well-weighed raw materials are ground and mixed evenly for the first sintering; the sintering temperature is maintained at 800° C.-950° C. and constant for 10 to 15 hours to decompose and remove $CO_2$, $NH_3$, and $H_2O$; after the first sintering, the raw materials are cooled down, ground and mixed evenly; then, they are pressed into round cake-like blocks for the second sintering; the sintering temperature is maintained at 1200-1400° C. and constant for 20 to 40 hours; finally, the yttrium strontium phosphate polycrystalline material is obtained through the solid-state reaction. More preferably, the sintering is performed in a sintering furnace by placing the raw materials in a ceramic crucible.

Preferably according to the invention, the yttrium strontium phosphate polycrystalline material repeats cooling coagulation and high-temperature melting 3-4 times after it is melted. The polycrystalline material repeats high-temperature melting and cooling coagulation multiple times to drain the bubbles generated in the melt, to reduce the crystal growth defect (bubble and inclusion, etc.), and to improve the growth quality. More preferably, after melting and repeating the cooling coagulation and high-temperature melting process several times, the yttrium strontium phosphate polycrystalline material is overheated 10-20° C. for 0.5-2 hours to melt more evenly.

Preferably according to the invention, when an iridium crucible is used, to prevent iridium from oxidizing at high temperatures, the crystal is grown in an inert atmosphere of nitrogen or argon. In particular, the volume fraction of the nitrogen or inert gases inside the single crystal growing furnace is 90-95%.

As the yttrium strontium phosphate single crystal has a melting point higher than that of the platinum (1772° C.), iridium, which has a higher melting point, is used as the seed crystal when the single crystal is grown for the first time. After the yttrium strontium phosphate single crystal is obtained, the yttrium strontium phosphate single crystal may be selected as the seed crystal.

According to the invention, the crystal growth process comprises four stages: necking, shouldering, performing constant diameter growth, and extracting crystal. Preferably, during the necking stage, the pulling rate is controlled between 2 and 5 mm/h; after the diameter of the seed crystal is narrowed to 0.5-2.0 mm, the single crystal is cooled down slowly at 0.5-5° C./h for shouldering. During the shouldering stage, the pulling rate is reduced to 0.2-2 mm/h. When the shoulder diameter reaches the desired size, the crystal is heated up or cooled down at the rate of 0-5° C./h to perform constant diameter growth. During the constant diameter growth, the pulling rate is 0.4-0.7 mm/h, and the rotational rate is 6-8 r/min. After being pulled to the desired height, the crystal starts to be extracted.

More preferably, the method of extracting the crystal is as follows: the temperature is raised slowly at the rate of 10-50° C./h; when the bottom of the crystal has a tendency of inward shrinkage, the pulling rate is increased to 5-20 mm/h to pull the crystal away from the melt.

Preferably according to the invention, the yttrium strontium phosphate single crystal growth method in the invention also comprises an annealing treatment step. The annealing treatment step is as follows: the yttrium strontium phosphate single crystal is taken out after it is fully grown and placed in a high-temperature muffle furnace for annealing treatment at 1200-1400° C. The time of annealing is preferred to be 24-48 hours so that the thermal stress generated during the growth of the $Sr_3Y(PO_4)_3$ single crystal can be fully released.

According to actual needs, the $Sr_3Y(PO_4)_3$ single crystal in the invention can generally grow to a diameter of 15-30 mm and a height of 20-50 mm. The $Sr_3Y(PO_4)_3$ single crystal usually needs 4-5 days to grow to such a size. The said size of the crystal refers to the regular diameter and total height.

A preferred embodiment of the invention and a preparation method of the yttrium strontium phosphate single crystal, comprising the following steps:

a. Proportioning

The raw materials $SrCO_3$, $Y_2O_3$, and $NH_4H_2PO_4$ are weighed by stoichiometric proportions according to the general formula $Sr_3Y(PO_4)_3$ of the yttrium strontium phosphate. Then, the $NH_4H_2PO_4$ is further added to exceed the mass percent by 3-7% (based on the total mass of the phosphate).

(2) Polycrystalline Material Synthesis

The well-weighed raw materials in step (1) are ground, evenly mixed, and placed in a ceramic crucible for the first sintering; the sintering temperature is maintained at 800° C.-950° C. and constant for 10 to 15 hours; after the first sintering, the raw materials are cooled down, ground, and evenly mixed; then, they are pressed into round cake-like blocks and placed in the ceramic crucible for the second sintering; the sintering temperature is maintained at 1200-1400° C. and constant for 20 to 40 hours. The final stage is a solid-stage reaction stage and aims to obtain the pure yttrium strontium phosphate polycrystalline material.

(3) Polycrystalline Material Melting

The yttrium strontium phosphate polycrystalline material synthesized in step (2) is placed in the iridium crucible of a single crystal growing furnace; before that, the furnace has been evacuated and filled with protective gas nitrogen or argon; the polycrystalline material is heated up with the medium-frequency induction heating method till melting; it is cooled down to coagulate after melting thoroughly and then heated up again to fully melt; this process is repeated several times to drain the bubbles from the melt; then, the melt is overheated 10-20° C. for 0.5-2 hours to obtain the homogeneously melted yttrium strontium phosphate melt.

(4) Czochralski Crystal Growth

An iridium rod or a yttrium strontium phosphate single crystal is used as the seed crystal and lowered vertically to the melt level of the yttrium strontium phosphate in step (3) to have the bottom perpendicular to and just in contact with the melt for single crystal growth. The growth temperature of the single crystal is 1700-1850° C. The crystal growth process comprises four stages: necking, shouldering, performing constant diameter growth, and extracting crystal. During the necking stage, the pulling rate is controlled between 2 and 5 mm/h; after the diameter of the seed crystal is narrowed to 0.5-2.0 mm, the single crystal begins to be cooled down slowly at 0.5-5° C./h for shouldering. During the shouldering stage, the pulling rate is reduced to 0.2-2 mm/h. When the shoulder diameter reaches the desired size, the crystal is heated up or cooled down at the rate of 0-5° C./h to perform constant diameter growth. After being pulled to the desired height, the crystal starts to be extracted. After extracting, the crystal is maintained at a constant temperature in the thermal field for 0.5-1 h and then cooled down at a rate of 5-30° C./h to room temperature to obtain the yttrium strontium phosphate single crystal.

(5) Annealing Treatment

The yttrium strontium phosphate single crystal is taken out from the single crystal growing furnace and placed in a high-temperature muffle furnace for annealing treatment at 1200-1400° C. The time of annealing is 24-48 hours.

More preferably according to the invention, the pulling rate during the necking stage is 3-5 mm/h, and the rotation rate is 8-15 r/min; during the shouldering stage, the pulling rate is 0.3-0.8 mm/h, and the rotation rate is 6-10 r/min; while performing constant diameter growth, the pulling rate is 0.5-0.6 mm/h, and the rotation rate is 8 r/min.

Preferably according to the invention, the raw materials all use high-purity ingredients with a purity of greater than 99.9%. All raw materials for single crystal growth can be purchased through conventional means.

The yttrium strontium phosphate ($Sr_3Y(PO_4)_3$) crystal presented in the invention is a novel piezoelectric single crystal. It is of a non-centrosymmetric single crystal structure and belongs to the −43m point group of the cubic crystal system. It features excellent mechanical properties, congruent melting, and difficulty in deliquesce. It can grow large-size and high-quality single crystals in a short time by using the Czochralski method. Due to the non-centrosymmetric structure, it is suitable to be used as nonlinear optical crystal or piezoelectric crystal.

The $Sr_3Y(PO_4)_3$ single crystal presented in the invention has the following applications:

The $Sr_3Y(PO_4)_3$ single crystal in the invention can be used as nonlinear optical crystal or piezoelectric crystal. Preferably, the $Sr_3Y(PO_4)_3$ single crystal can be used as laser host crystal, nonlinear frequency conversion crystal, or high-temperature piezoelectric crystal.

According to the invention, the application of the $Sr_3Y(PO_4)_3$ single crystal as nonlinear optical crystal and piezoelectric crystal is further described as follows:

As nonlinear optical crystal:

Upon crystallographic axis orientation of the $Sr_3Y(PO_4)_3$ crystal by an X-ray orientation unit, the frequency doubling effect can be observed when the single crystal is subjected to a 2090 nm laser. Therefore, the crystal can achieve the effective frequency doubling of the 2090 nm laser light. During this process, an $AgGaS_2$ crystal is used as a control, as shown in FIG. 12.

As piezoelectric single crystal:

Upon measurement with the impedance method, the single crystal has an effective piezoelectric constant d14=6-10 PC/N. By means of impedance analysis, its effective coupling factor K14=10-30% according to the measurement and calculation. When $Sr_3Y(PO_4)_3$ single crystals of different cutting orientations are heated up from room temperature to 1000° C., their piezoelectric activity has not changed, as shown in FIG. 14, indicating that the single crystal has potential applications in the piezoelectric field, especially the high-temperature piezoelectric field. The said cutting orientations of the $Sr_3Y(PO_4)_3$ single crystal are XZ, XY, or ZX, or cutting orientations obtained by XZ, XY, and ZX rotating around X, Y, or Z respectively.

More preferably, the $Sr_3Y(PO_4)_3$ single crystal as described in the invention can be applied to produce non-linear optical function devices and piezoelectric devices. The nonlinear optical functional devices comprise laser frequency converters, optical parameter amplifiers, optical parameter oscillators or Raman frequency converters. The piezoelectric devices include piezoelectric resonators, oscillators, filters, piezoelectric transducers, piezoelectric pressure sensors, acoustic transducers, or ultrasonic sensors.

For matters not specifically provided in the above method, the prior art in the field shall prevail.

The technical features and beneficial effects of the invention are provided as follows:

The author of the invention has found upon studies that the $M_3RE(PO_4)_3$ piezoelectric single crystal has a very narrow congruent melting zone, which is distinguished from other compounds with the same structure type. Hence, it requires excessive phosphate or phosphorus pentoxide (exceeding the normal mass percent by 1.5-10%) to compensate for the component deviation caused by volatilization of the phosphorus pentoxide during the single crystal growth. Only by doing this can high-quality single crystals meeting the requirements for high optical quality single crystals be obtained. If the stoichiometric proportions are followed, no single crystal can be grown.

During the preparation of the polycrystalline material in the invention, the raw materials are sintered twice at high temperatures after being mixed. The first high-temperature sintering is conducted at a temperature below the melting point to decompose and remove $CO_2$, $NH_3$, and $H_2O$; the second high-temperature sintering is conducted at the solid-phase reaction temperature to prepare high-purity polycrystalline material and ensure the growth quality of the single crystal. During single crystal growth, the single crystal needs to be seeded at the full melting point. The technical key during the single crystal growth is to control the pulling rate and the rotation rate at each stage so as to obtain high-quality single crystal. The invention can grow large-size $M_3RE(PO_4)_3$ single crystals with high-quality photoelectric functions in a short time by using the Czochralski method.

The invention provides a novel $M_3RE(PO_4)_3$ piezoelectric single crystal featuring photoelectric functions, excellent mechanical properties, difficulty in deliquesce, and congruent melting. Due to the non-centrosymmetric structure, it is suitable to be used as nonlinear optical crystal and piezoelectric crystal. It has a variety of advantages when applied as nonlinear optical crystal and piezoelectric crystal, including high melting point, no phase transition from room temperature to the melting point, stable chemical properties, and difficulty in deliquescence. As a hard-won compound with both a high melting point and a non-centrosymmetric structure, it has obvious advantages in high-temperature piezoelectric and wide-temperature nonlinear optical fields. Additionally, as the melt of the single crystal has a low viscosity, impurities can be removed easily during the single crystal growth to facilitate fast crystal growth, making it easy to obtain high-quality single crystals and contributing to the subsequent application research and development.

The author of the invention has found by accident that the yttrium strontium phosphate single crystal has a very narrow congruent melting zone, which is distinguished from other compounds with the same structure type. The invention has created the method of using excessive (exceeding the normal mass percent by 2.5-7.5%) P-containing compounds (phosphate or phosphorus pentoxide) to obtain high-quality yttrium strontium phosphate single crystal that meets the high optical quality requirements. Studies have found that yttrium strontium phosphate single crystal cannot be grown if the stoichiometric proportions are followed, nor can it meet the high optical quality requirements if the phosphate or phosphorus pentoxide is not excessive enough.

The invention presents a novel $Sr_3Y(PO_4)_3$ piezoelectric single crystal. The $Sr_3Y(PO_4)_3$ single crystal has a variety of advantages when applied as nonlinear optical crystal and piezoelectric crystal, including high melting point (higher than 1800° C.), no phase transition from room temperature to the melting point, stable chemical properties, and difficulty in deliquescence. As a hard-won compound with both a high melting point and a non-centrosymmetric structure, it has obvious advantages in high-temperature piezoelectric and wide-temperature nonlinear optical fields. Additionally, as the melt of the single crystal has a low viscosity, impurities can be removed easily during the single crystal growth to facilitate fast crystal growth, making it easy to obtain high-quality single crystal and contributing to the subsequent application research and development.

EMBODIMENTS

Figure 1:
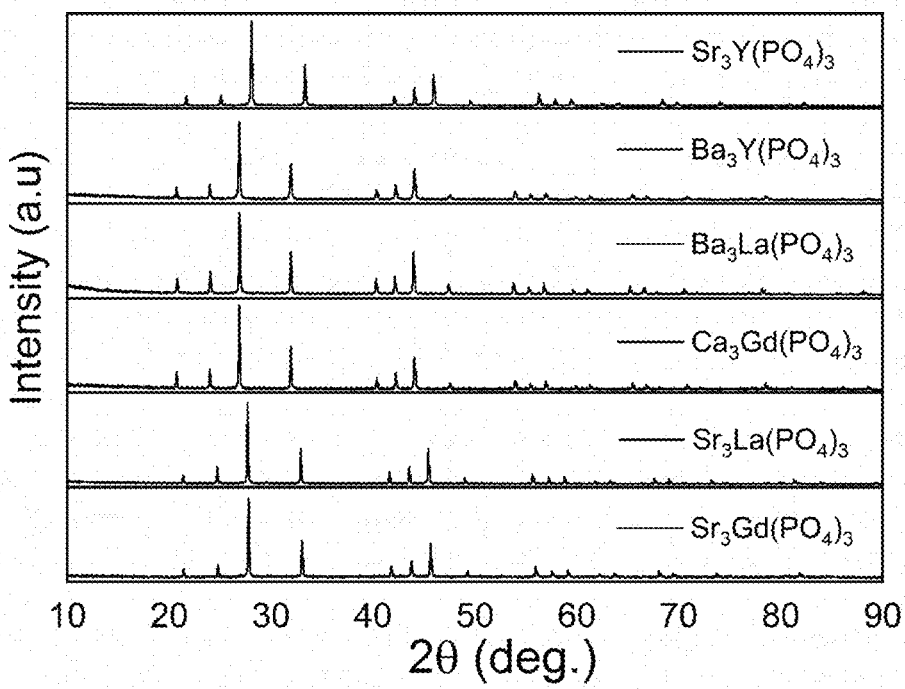
FIG. 1 is the XRD phase diagram of the $M_3R(PO_4)_3$ single crystal.

The invention is further described as follows in combination with the specific embodiments and the attached figures. The embodiments set out here are used to explain the invention only, but not all. The raw materials used in Embodiments 1-6 are of purity greater than 99.9%.

Embodiment 1. Preparation of Yttrium Barium Phosphate Single Crystal a. $BaCO_3$, $Y_2O_3$, and $NH_4H_2PO_4$ are used as raw materials and blended following the stoichiometric proportions according to the chemical formula $Ba_3Y(PO_4)_3$ of the yttrium barium phosphate. Then, the $NH_4H_2PO_4$ is further added to exceed the mass percent by 5%.

b. The raw materials well prepared in step (1) are evenly mixed and placed in an aluminum oxide crucible and a muffle furnace for the first sintering; the sintering temperature is maintained at 850±50° C. and constant for 12 hours to remove the $CO_2$, $NH_3$, and $H_2O$ in the raw materials; after the first sintering, the raw materials are cooled down, ground, and evenly mixed; then, they are pressed into blocks with a cylindrical mold and placed in the aluminum oxide crucible for solid-phase reaction; the sintering temperature is maintained at 1350° C. and constant for 40 hours to obtain the yttrium barium phosphate polycrystalline material.

c. The yttrium barium phosphate polycrystalline material synthesized in step (2) is placed in the iridium crucible of a single crystal growing furnace; before that, the furnace has been evacuated and filled with nitrogen as protective gas; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 0.5 hours to obtain the homogeneously melted yttrium barium phosphate melt.

d. An yttrium barium phosphate polycrystalline rod is used as the seed crystal and immersed into the polycrystalline melt in step (3) to have the top of the crystal perpendicular to and just in contact with the melt for single crystal growth.

The technological conditions of the single crystal growth are as follows: the growth temperature is 1850±50° C.; the pulling rate during necking of the seed crystal is 5 mm/h; after the diameter of the seed crystal is narrowed to around 1 mm, the single crystal begins to be cooled down slowly at 1-4° C./h for shouldering; during the shouldering, the pulling rate is reduced to 0.5-1 mm/h; when the shoulder diameter reaches around the desired size (22 mm), the crystal is heated up or cooled down at the rate of 1-4° C./h to perform constant diameter growth, during which the pulling rate is 0.5-0.7 mm/h; after the single crystal grows to the required size of about a 40 mm height, the crystal starts to be extracted as follows: first, the temperature is raised slowly at the rate of 15-20° C./h, and when the bottom of the crystal has a tendency of inward shrinkage, the pulling rate is increased to 10-15 mm/h to pull the crystal away from the melt.

After extracting, the crystal is maintained at a constant temperature in the thermal field for 45 min and then cooled down at a rate of 10° C./h to room temperature to obtain the yttrium barium phosphate crystal.

(5) After being taken out, the crystal is placed in a high-temperature resistance furnace for annealing treatment at 1300° C. The time of annealing is 24 hours so that the thermal stress generated during the growth of the $Ba_3Y$ $(PO_4)_3$ crystal can be fully released.

Figure 2:
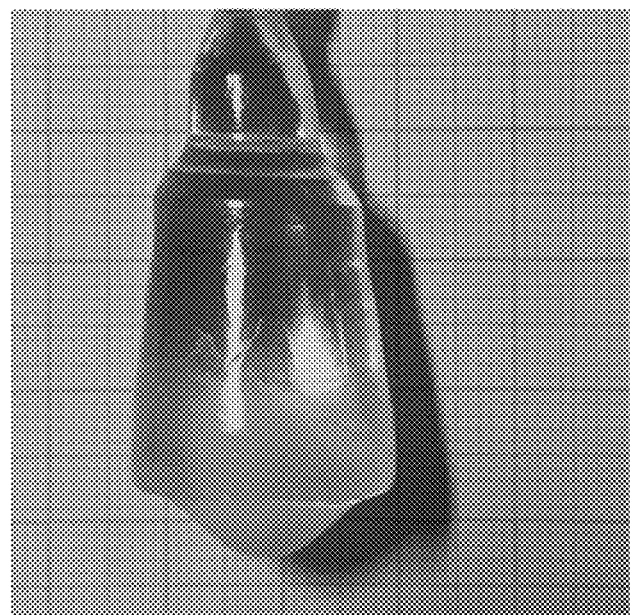
FIG. 2 shows the picture of the $Ba_3Y(PO_4)_3$ single crystal grown in Embodiment 1.

The obtained $Ba_3Y(PO_4)_3$ single crystal is as shown in FIG. 2. It has good optical properties.

Embodiment 2. Preparation of Lanthanum Barium Phosphate Single Crystal a. $BaCO_3$, $La_2O_3$, and $NH_4H_2PO_4$ are used as raw materials and blended following the stoichiometric proportions according to the chemical formula $Ba_3La(PO_4)_3$ of the lanthanum barium phosphate. Then, the $NH_4H_2PO_4$ is further added to exceed the mass percent by 5%.

b. The raw materials well prepared in step (1) are evenly mixed and placed in an aluminum oxide crucible for the first sintering; the sintering temperature is maintained at 900° C. and constant for 10 hours to decompose and remove the $CO_2$, $NH_3$, and $H_2O$; after the first sintering, the raw materials are cooled down, ground, and evenly mixed; then, they are pressed into blocks and placed in the aluminum oxide crucible for solid-phase reaction; the sintering temperature is maintained at 1400° C. and constant for 30 hours to obtain the lanthanum barium phosphate polycrystalline material.

c. The lanthanum barium phosphate polycrystalline material synthesized in step (2) is placed in the iridium crucible of a single crystal growing furnace; before that, the furnace has been evacuated and filled with nitrogen as protective gas to prevent oxidation of the iridium crucible; the polycrystalline material is heated up with the medium-frequency induction heating method till melting; it is cooled down to coagulate after melting thoroughly and then heated up again to fully melt; this process is repeated 2-4 times to drain the bubbles from the melt; then, the melt is overheated 15° C. for 1 hour to obtain the homogeneously melted lanthanum barium phosphate melt.

d. An iridium rod is used as the seed crystal and immersed into the polycrystalline melt in step (3) to have the top of the crystal perpendicular to and just in contact with the melt for single crystal growth.

The technological conditions of the single crystal growth are as follows: the growth temperature is 1850±50° C.; the pulling rate during necking of the seed crystal is 6 mm/h;

after the diameter of the seed crystal is narrowed to around 1.5 mm, the single crystal begins to be cooled down slowly at 5° C./h for shouldering; during the shouldering, the pulling rate is reduced to 0.3 mm/h; when the shoulder diameter reaches around the desired size (30 mm), the crystal is heated up or cooled down at the rate of 0-5° C./h to perform constant diameter growth, during which the pulling rate is 0.6 mm/h; after the crystal grows to the required size of about a 50 mm height, the crystal is extracted. The extracting process is as follows: first, the temperature is raised slowly at the rate of 20° C./h, and when the bottom of the crystal has a tendency of inward shrinkage, the pulling rate is increased to 15 mm/h to pull the crystal away from the melt.

Figure 3:
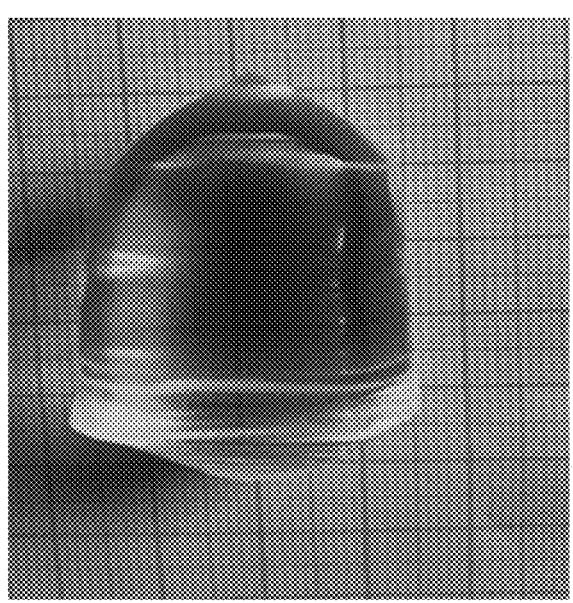
FIG. 3 shows the picture of the $Ba_3La(PO_4)_3$ single crystal grown in Embodiment 2.

(5) After extracting, the crystal is maintained at a constant temperature in the thermal field for 1 h and then cooled down at a rate of 10° C./h to room temperature to obtain the lanthanum barium phosphate single crystal. The obtained $Ba_3La(PO_4)_3$ single crystal is as shown in FIG. 3. It has good optical properties.

The annealing treatment of the crystal is the same as that in Embodiment 1.

Embodiment 3. Preparation of Gadolinium Calcium Phosphate Single Crystal a. $CaCO_3$, $Gd_2O_3$, and $NH_4H_2PO_4$ are used as raw materials and blended following the stoichiometric proportions according to the chemical formula $Ca_3Gd(PO_4)_3$ of the gadolinium calcium phosphate. Then, the $NH_4H_2PO_4$ is further added to exceed the mass percent by 3.5%.

b. The raw materials well prepared in step (1) are evenly mixed and placed in an aluminum oxide crucible and a muffle furnace for the first sintering; the sintering temperature is maintained at 900° C. and constant for 13 hours to remove the $CO_2$, $NH_3$, and $H_2O$ in the raw materials; after the first sintering, the raw materials are cooled down, ground, and evenly mixed; then, they are pressed into blocks with a cylindrical mold and placed in the aluminum oxide crucible for solid-phase reaction; the sintering temperature is maintained at 1350° C. and constant for 30 hours to obtain the gadolinium calcium phosphate polycrystalline material.

c. The gadolinium calcium phosphate polycrystalline material synthesized in step (2) is placed in the iridium crucible of a single crystal growing furnace; before that, the furnace has been evacuated and filled with nitrogen as protective gas; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 0.5 hours to obtain the homogeneously melted gadolinium calcium phosphate melt.

d. An iridium rod is used as the seed crystal and immersed slowly into the polycrystalline melt in step (3) to have the top of the crystal perpendicular to and just in contact with the melt for single crystal growth.

The technological conditions of the single crystal growth are as follows: the growth temperature is 1800±50° C.; the pulling rate during necking of the seed crystal is 5 mm/h; after the diameter of the seed crystal is narrowed to around 1 mm, the single crystal begins to be cooled down slowly at 3° C./h for shouldering; during the shouldering, the pulling rate is reduced to 0.3-1 mm/h; when the shoulder diameter reaches around the desired size (15-25 mm), the crystal is heated up or cooled down at the rate of 1-4° C./h to perform constant diameter growth, during which the pulling rate is 0.5 mm/h; after the single crystal grows to the required size of about a 30-50 mm height, the crystal starts to be extracted as follows: first, the temperature is raised slowly at the rate of 25° C./h, and when the bottom of the crystal has a tendency of inward shrinkage, the pulling rate is increased to 15-20 mm/h to pull the crystal away from the melt.

Figure 4:
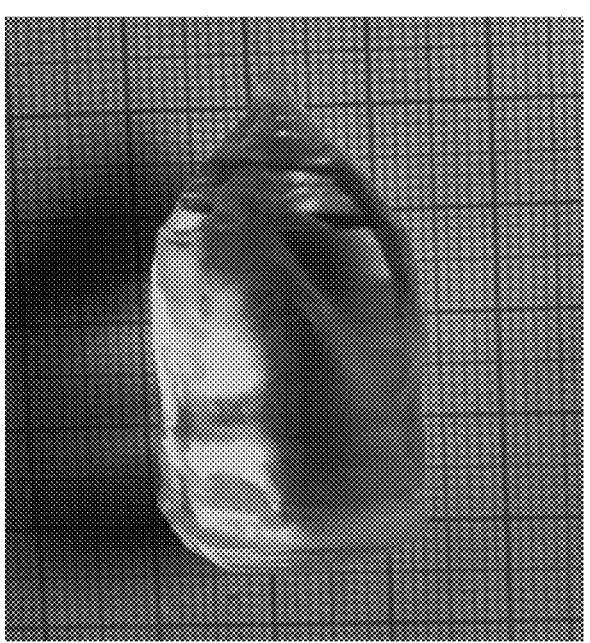
FIG. 4 shows the picture of the $Ca_3Gd(PO_4)_3$ single crystal grown in Embodiment 3.
Figure 5:
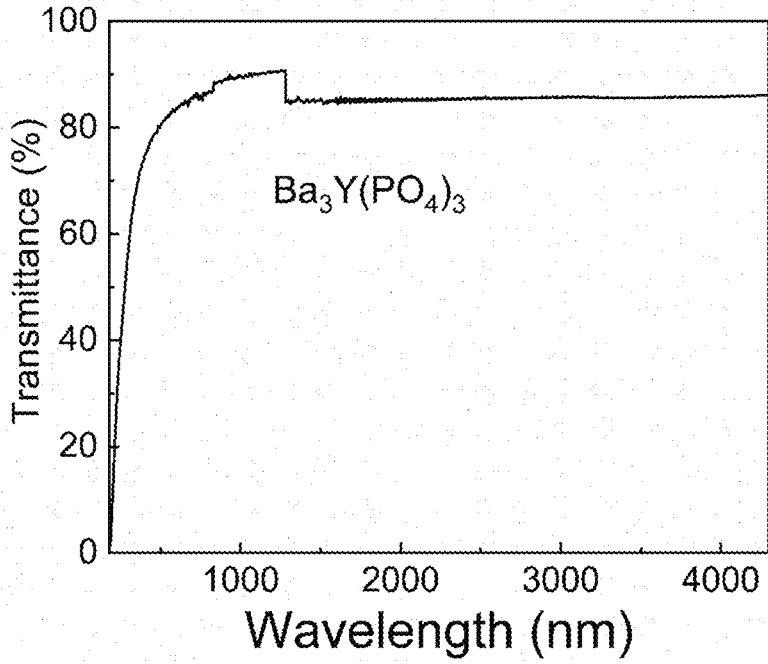
FIG. 5 shows the transmission spectrum of the $Ba_3Y(PO_4)_3$ single crystal in Embodiment 1.
Figure 6:
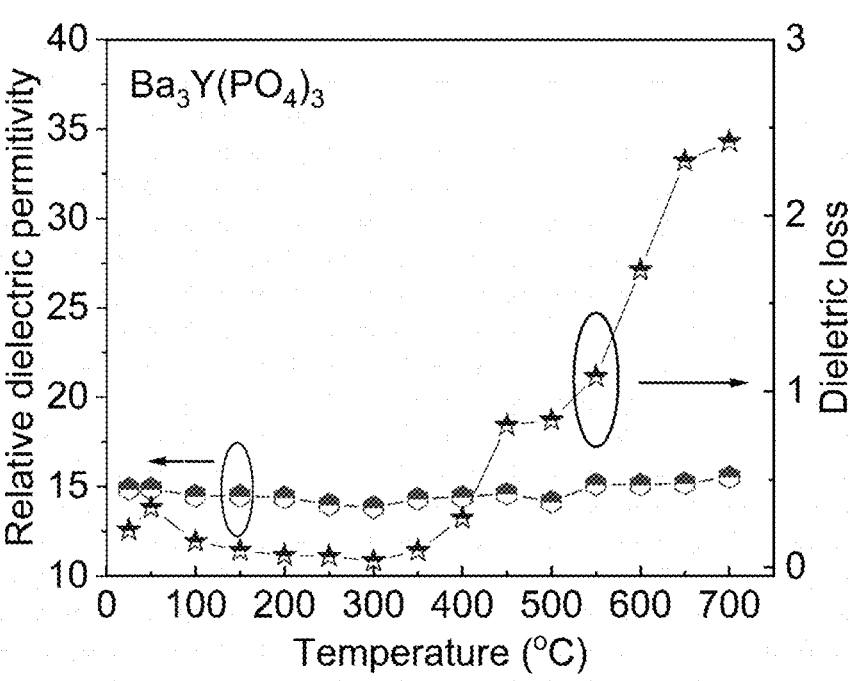
FIG. 6 shows the dielectric spectrum of the $Ba_3Y(PO_4)_3$ single crystal in Embodiment 1.

After extracting, the crystal is maintained at a constant temperature in the thermal field for 45 min and then cooled down at a rate of 10° C./h to room temperature to obtain the gadolinium calcium phosphate single crystal. The obtained $Ca_3Gd(PO_4)_3$ single crystal is as shown in FIG. 4. It has good optical properties.

The annealing treatment of the crystal is the same as that in Embodiment 1.

Embodiment 4. Preparation of Strontium Lanthanum Phosphate Single Crystal a. $SrCO_3$, $La_2O_3$, and $NH_4H_2PO_4$ are used as raw materials and blended following the stoichiometric proportions according to the chemical formula $Sr_3La(PO_4)_3$ of the lanthanum strontium phosphate. Then, the $NH_4H_2PO_4$ is further added to exceed the mass percent by 3%.

b. The raw materials well prepared in step (1) are evenly mixed and placed in an aluminum oxide crucible and a muffle furnace for the first sintering; the sintering temperature is maintained at 850 and constant for 15 hours to remove the $CO_2$, $NH_3$, and $H_2O$ in the raw materials; after the first sintering, the raw materials are cooled down, ground, and evenly mixed; then, they are pressed into blocks with a cylindrical mold and placed in the aluminum oxide crucible for solid-phase reaction; the sintering temperature is maintained at 1300-1400° C. and constant for 20-30 hours to obtain the strontium lanthanum phosphate polycrystalline material.

c. The strontium lanthanum phosphate polycrystalline material synthesized in step (2) is placed in the iridium crucible of a single crystal growing furnace; before that, the furnace has been evacuated and filled with nitrogen as protective gas; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 0.5 hours to obtain the homogeneously melted strontium lanthanum phosphate melt.

d. An iridium rod is used as the seed crystal and immersed slowly into the polycrystalline melt in step (3) to have the top of the crystal perpendicular to and just in contact with the melt for single crystal growth.

The technological conditions of the single crystal growth are as follows: the growth temperature is 1800-1900° C.; the pulling rate during necking of the seed crystal is 6 mm/h; after the diameter of the seed crystal is narrowed to around 1 mm, the single crystal begins to be cooled down slowly at 1-3° C./h for shouldering; during the shouldering, the pulling rate is reduced to 0.4 mm/h; when the shoulder diameter reaches around the desired size (15-25 mm), the crystal is heated up or cooled down at the rate of 1-4° C./h to perform constant diameter growth, during which the pulling rate is 0.6 mm/h; after the single crystal grows to the required size of about a 20-35 mm height, the crystal is extracted as follows: first, the temperature is raised slowly at the rate of 20° C./h, and when the bottom of the crystal has a tendency of inward shrinkage, the pulling rate is increased to 10-15 mm/h to pull the crystal away from the melt.

After extracting, the crystal is maintained at a constant temperature in the thermal field for 45 min and then cooled down at a rate of 10° C./h to room temperature to obtain the strontium lanthanum phosphate single crystal. The annealing treatment of the crystal is the same as that in Embodiment 1.

Figure 7:
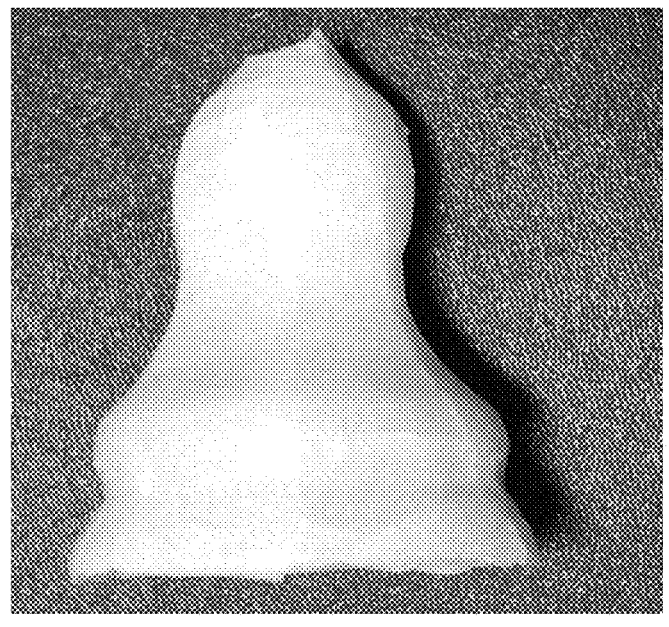
FIG. 7 shows the picture of the product in Comparative Example 1, a $Ba_3Y(PO_4)_3$ polycrystal obtained by following the stoichiometric proportions.

Comparative Example 1: Preparation of the Yttrium Barium Phosphate Single Crystal According to the Stoichiometric Proportions As described in Embodiment 1, provided however that, in step (1), the raw materials $BaCO_3$, $Y_2O_3$, and $NH_4H_2PO_4$ are mixed by stoichiometric proportions according to the chemical formula $Ba_3Y(PO_4)_3$ of the yttrium barium phosphate, and no excessive $NH_4H_2PO_4$ is used. The results show that the $Ba_3Y(PO_4)_3$ single crystal cannot be grown as component deviation and stratification occurs after the yttrium barium phosphate raw materials are melted. The resulting product is $Ba_3Y(PO_4)_3$ polycrystal, as shown in FIG. 7.

Comparative Example 2: Preparation of the Gadolinium Calcium Phosphate Single Crystal With Excessive $NH_4H_2PO_4$ (Exceeding its Mass Percent by 0.5%)

Figure 8:
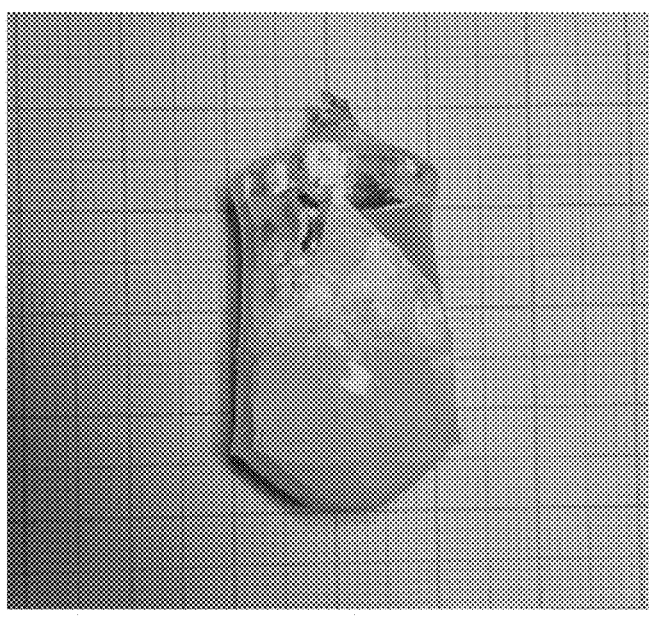
FIG. 8 shows the picture of the product in Comparative Example 2, a $Ca_3Gd(PO_4)_3$ single crystal with poor optical properties.

As described in Embodiment 3, provided however that, in step (1), the raw materials $CaCO_3$, $Gd_2O_3$, and $NH_4H_2PO_4$ are blended according to the stoichiometric proportions of the chemical formula $Ca_3Gd(PO_4)_3$, and $NH_4H_2PO_4$ is further added to exceed the mass percent by 0.5%. The resulting single crystal has poor properties, as shown in FIG. 8. Studies have found that the 0.5% excessive phosphate is insufficient to compensate for the component deviation caused by phosphorus volatilization during the single crystal growth, resulting in poor crystallinity of the gadolinium calcium phosphate single crystal.

Embodiment 5. Preparation of Yttrium Strontium Phosphate Single Crystal a. $SrCO_3$, $Y_2O_3$, and $NH_4H_2PO_4$ are used as raw materials and blended following the stoichiometric proportions according to the chemical formula $Sr_3Y(PO_4)_3$ of the yttrium strontium phosphate. Then, the $NH_4H_2PO_4$ is further added to exceed the mass percent by 3%.

b. The raw materials well prepared in step (1) are evenly mixed and placed in an aluminum oxide crucible for the first sintering; the sintering temperature is maintained at 900° C. and constant for 10 hours to decompose and remove the $CO_2$, $NH_3$, and $H_2O$; after the first sintering, the raw materials are cooled down, ground, and evenly mixed; then, they are pressed into blocks and placed in the aluminum oxide crucible for solid-phase reaction; the sintering temperature is maintained at 1250° C. and constant for 48 hours to obtain the yttrium strontium phosphate polycrystalline material.

c. The yttrium strontium phosphate polycrystalline material synthesized in step (2) is placed in the iridium crucible of a single crystal growing furnace; before that, the furnace has been evacuated and filled with nitrogen as protective gas to prevent the oxidation of the iridium crucible; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 1 hour to obtain the homogeneously melted yttrium strontium phosphate melt.

d. An iridium rod is used as the seed crystal and immersed slowly into the polycrystalline melt in step (3) to have the top of the crystal perpendicular to and just in contact with the melt for single crystal growth.

The technological conditions of the single crystal growth are as follows: the growth temperature is 1800° C.; the pulling rate during necking of the seed crystal is 3-3.5 mm/h, and the rotation rate is 8-15 r/min; after the diameter of the seed crystal is narrowed to 1 mm, the single crystal begins to be cooled down slowly at 0.5° C./h for shouldering; during the shouldering, the pulling rate is reduced to 0.3-0.4 mm/h, and the rotation rate is 6-8 r/min; when the shoulder diameter reaches the desired size (20 mm), the crystal is heated up or cooled down at the rate of 0.3° C./h to perform constant diameter growth, during which the pulling rate is 0.5 mm/h and the rotation rate is 8 r/min; after the single crystal grows to the required size of about a 36 mm height, the crystal starts to be extracted. The extracting process is as follows: first, the temperature is raised at the rate of 20° C./h, and when the bottom of the crystal has a tendency of inward shrinkage, the pulling rate is increased to 5 mm/h to pull the crystal away from the melt. After extracting, the crystal is maintained at a constant temperature in the thermal field for 1 h and then cooled down at a rate of 10° C./h to room temperature to obtain the yttrium strontium phosphate single crystal.

(5) After being taken out, the crystal is placed in a high-temperature resistance furnace for annealing treatment at 1300° C. The time of annealing is 24 hours so that the thermal stress generated during the growth of the $Sr_3Y(PO_4)_3$ single crystal can be fully released.

Figure 9:
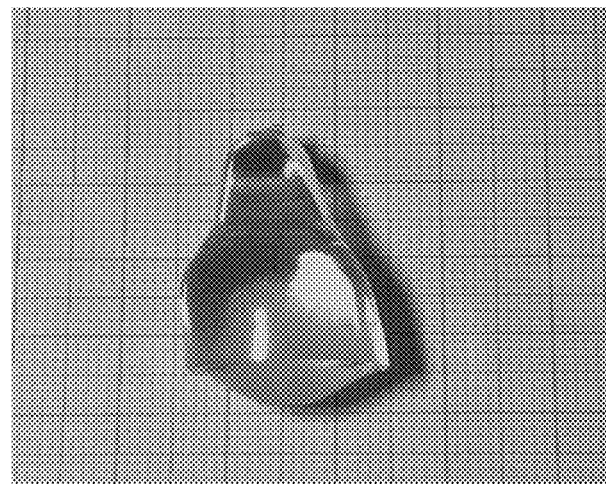
FIG. 9 shows the picture of the $Sr_3Y(PO_4)_3$ single crystal grown in Embodiment 5.
Figure 10:
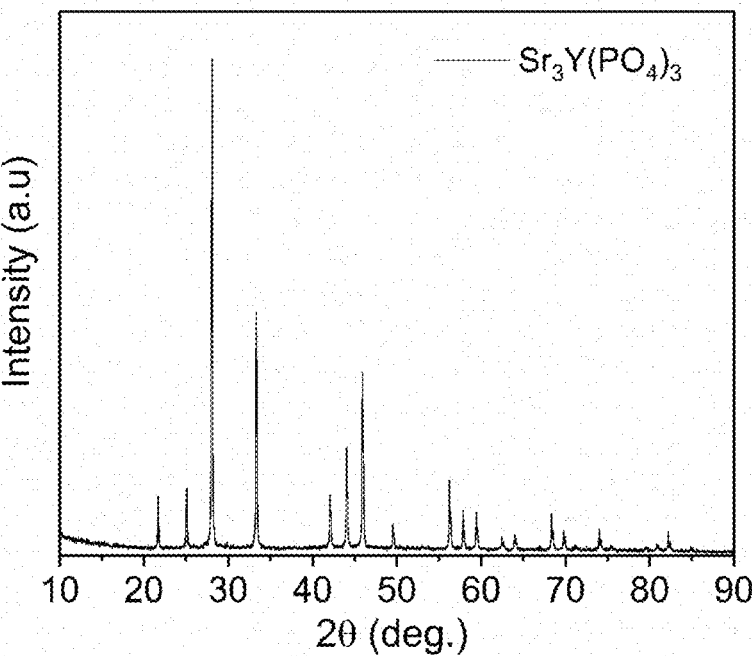
FIG. 10 shows the X-ray diffraction spectrogram of the $Sr_3Y(PO_4)_3$ single crystal.
Figure 11:
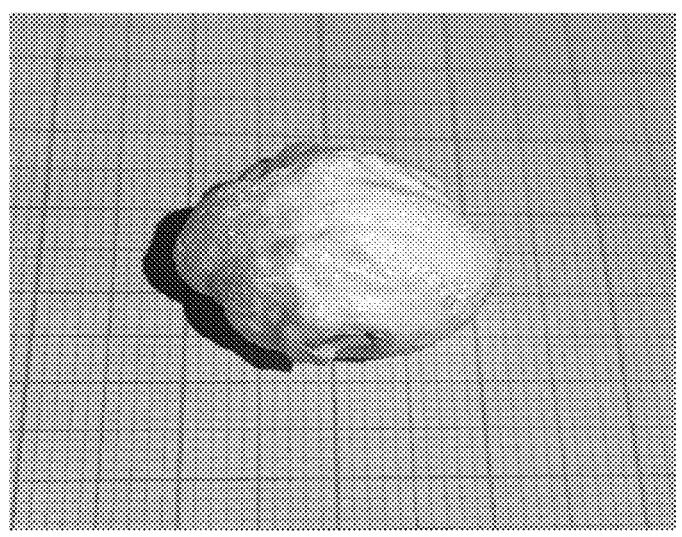
FIG. 11 shows the picture of the product grown with the method in Comparative Example 3.

The picture of the obtained $Sr_3Y(PO_4)_3$ single crystal is shown in FIG. 9. The X-ray diffraction spectrum of the resulting crystal shows characteristic peaks at $2\theta=27.88$, $33.13°$, and $45.74°$, as shown in FIG. 10.

Figure 12:
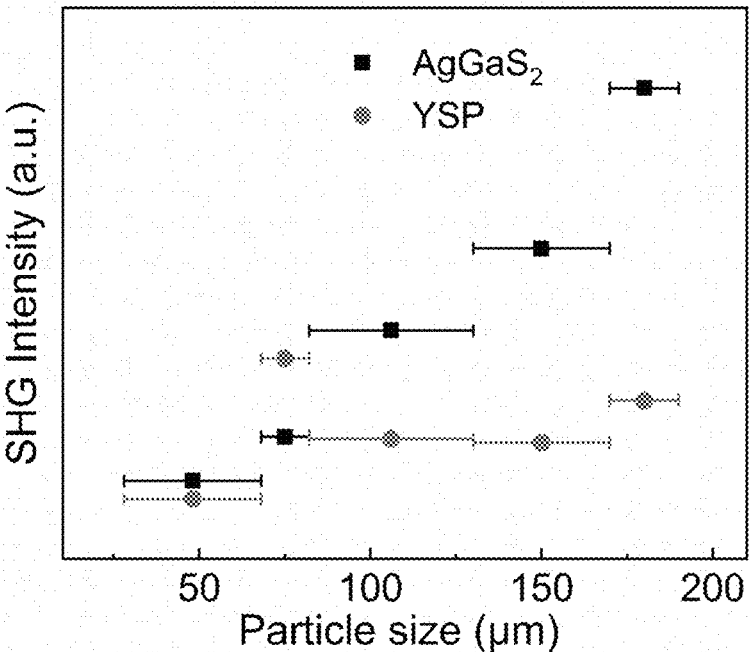
FIG. 12 shows the 2090 nm frequency doubling data of the $Sr_3Y(PO_4)_3$ single crystal in Embodiment 5. An $AgGaS_2$ single crystal is used as a control. The horizontal coordinate is the particle size of the yttrium strontium phosphate single crystal and $AgGaS_2$ single crystal samples, and the vertical coordinate is the relative intensity.

The $Sr_3Y(PO_4)_3$ single crystal obtained can effectively achieve the frequency doubling effect of the 2090 nm laser light, as shown in FIG. 12, and an AgGaS2 single crystal is used as a control, indicating that the $Sr_3Y(PO_4)_3$ single crystal can achieve effective frequency doubling in the infrared band.

Figure 13:
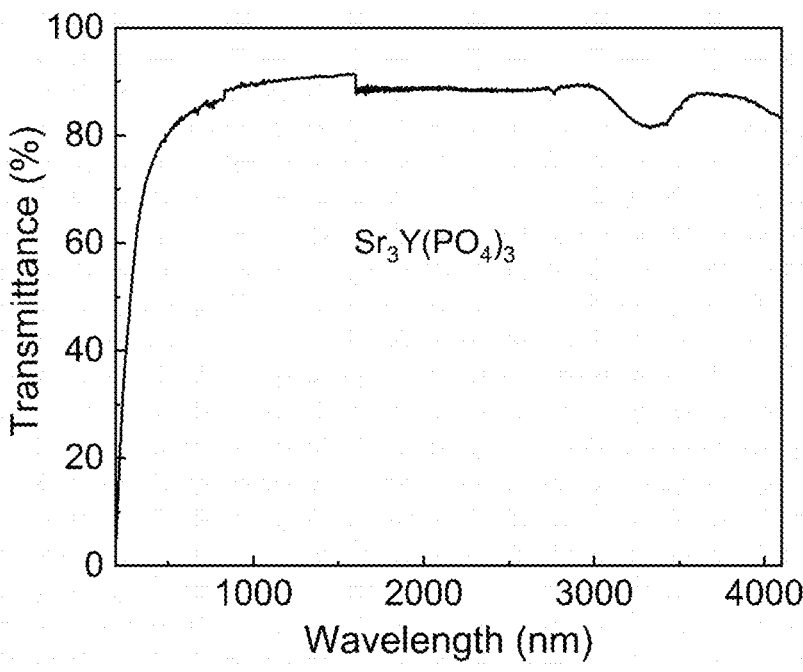
FIG. 13 shows the transmission spectrum of the $Sr_3Y$ $(PO_4)_3$ single crystal in Embodiment 5.

The transmission spectrum of the $Sr_3Y(PO_4)_3$ single crystal is shown in FIG. 13. The crystal obtained has a transmittance of >80% in the 480 nm-4100 nm band, indicating that it has good optical uniformity. Its absorption cutoff edge is less than 180 nm, indicating that it has potential application in the deep ultraviolet band

Embodiment 6. Preparation of Gadolinium Strontium Phosphate Single Crystal a. $SrCO_3$, $Gd_2O_3$, and $P_2O_5$ are used as raw materials and blended following the stoichiometric proportions according to the chemical formula $Sr_3Gd(PO_4)_3$ of the gadolinium strontium phosphate. Then, the $P_2O_5$ is further added to exceed the mass percent by 5%.

b. The raw materials well prepared in step (1) are evenly mixed and placed in an aluminum oxide crucible for the first sintering; the sintering temperature is maintained at 900° C. and constant for 15 hours to decompose and remove the $CO_2$, $NH_3$, and $H_2O$; after the first sintering, the raw materials are cooled down, ground, and evenly mixed; then, they are pressed into blocks and placed in the aluminum oxide crucible for solid-phase reaction; the sintering temperature is maintained at 1300° C. and constant for 48 hours to obtain the gadolinium strontium phosphate polycrystalline material.

c. The gadolinium strontium phosphate polycrystalline material synthesized in step (2) is placed in the iridium crucible of a single crystal growing furnace; before that, the furnace has been evacuated and filled with nitrogen as protective gas to prevent the oxidation of the iridium crucible; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 1 hour to obtain the homogeneously melted gadolinium strontium phosphate melt.

d. An yttrium strontium phosphate single crystal is used as the seed crystal and immersed slowly into the polycrystalline melt in step (3) to have the top of the crystal perpendicular to and just in contact with the melt for single crystal growth.

The technological conditions of the single crystal growth are as follows: the growth temperature is 1800° C.; the pulling rate during necking of the seed crystal is 4-4.5 mm/h, and the rotation rate is 8-15 r/min; after the diameter of the seed crystal is narrowed to 1 mm, the single crystal begins to be cooled down slowly at 0.8° C./h for shouldering; during the shouldering, the pulling rate is reduced to 0.4-0.5 mm/h, and the rotation rate is 6-8 r/min; when the shoulder diameter reaches the desired size (20 mm), the crystal is heated up or cooled down at the rate of 0.2° C./h to perform constant diameter growth, during which the pulling rate is 0.6 mm/h and the rotation rate is 8 r/min; after the single crystal grows to the required size of about a 30 mm height, the crystal starts to be extracted. The extracting process is as follows: first, the temperature is raised at the rate of 20° C./h, and when the bottom of the crystal has a tendency of inward shrinkage, the pulling rate is increased to 6 mm/h to pull the crystal away from the melt. After extracting, the crystal is maintained at a constant temperature in the thermal field for 1 h and then cooled down at a rate of 15° C./h to room temperature to obtain the yttrium strontium phosphate single crystal.

(5) After being taken out, the crystal is placed in a high-temperature resistance furnace for annealing treatment at 1300° C. The time of annealing is 24 hours so that the thermal stress generated during the growth of the $Sr_3Gd$ $(PO_4)_3$ single crystal can be fully released.

The $Sr_3Gd(PO_4)_3$ single crystal obtained is 20 mm in diameter and 30 mm in height. A frequency doubling effect is observed when it is subjected to a 2090 nm laser light. Upon tests, the single crystal has a transmittance of >80% in the 480 nm-4100 nm band and has good optical uniformity.

Comparative Example 3

As described in Embodiment 5, provided however that, in step (1), the raw materials $SrCO_3$, $Y_2O_3$, and $NH_4H_2PO_4$ are mixed by stoichiometric proportions according to the chemical formula $Sr_3Y(PO_4)_3$, and no excessive $NH_4H_2PO_4$ is used. The results show that the $Sr_3Y(PO_4)_3$ single crystal cannot be grown as component deviation and stratification occurs after the yttrium strontium phosphate raw materials are melted. The resulting product is $Sr_3Y(PO_4)_3$ polycrystal, as shown in FIG. 3.

Comparative Example 4

As described in Embodiment 5, provided however that, in step (1), the raw materials $SrCO_3$, $Y_2O_3$, and $NH_4H_2PO_4$ are blended following the stoichiometric proportions of the chemical formula $Sr_3Y(PO_4)_3$, and $NH_4H_2PO_4$ is further added to exceed the mass percent by 0.5%.

The resulting single crystal has poor properties and is of an irregular shape, as shown in FIG. 8. Studies have found that the 0.5% excessive phosphate is insufficient to compensate for the component deviation caused by phosphorus volatilization during the single crystal growth, resulting in poor crystallinity of the yttrium strontium phosphate single crystal.

Embodiment 7

Figure 14:
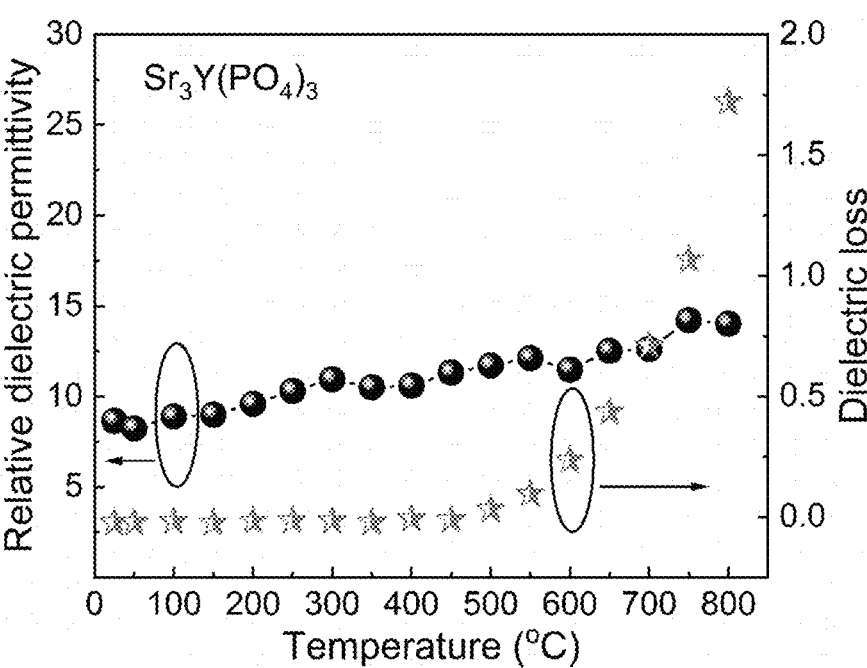
FIG. 14 shows the dielectric spectrum of the $Sr_3Y(PO_4)_3$ single crystal in Embodiment 7 with the XY cutting orientation.

After orienting the $Sr_3Y(PO_4)_3$ single crystal prepared in Embodiment 5 with reference to the physical piezoelectric axis, a crystal plate is processed along the X and Y directions of the physical axis, with the thickness in the X direction, length in the Y direction, and width in the Z direction. The crystal plate size is: thickness×width×length=1.2 mm×3.5 mm×10.0 mm, and the crystal face in the thickness direction is plated with a conducting electrode. Upon testing of the crystal plate sample with an impedance analyzer, piezoelectric resonance and anti-resonance peaks are detected, indicating that the single crystal has a piezoelectric effect in the cutting orientation. In particular, when the temperature is raised to 1000° C., piezoelectric resonance and anti-resonance peaks are still observed, indicating that the single crystal can be applied as a high-temperature piezoelectric crystal. See FIG. 14.

Embodiment 8

After orienting the $Sr_3Y(PO_4)_3$ single crystal prepared in Embodiment 6 with reference to the physical piezoelectric axis, a crystal plate is processed along the X and Y directions of the physical axis, with the thickness in the X direction, length in the Y direction, and width in the Z direction. The crystal plate size is: thickness×width×length=(0.5-1.5) mm×(3.0-4.0)mm×(8.0-12.0)mm, and the crystal face in the thickness direction is plated with a conducting electrode.

Upon testing of the crystal plate sample with an impedance analyzer, piezoelectric resonance and anti-resonance peaks are detected, indicating that the single crystal has a piezoelectric effect in the cutting orientation. The same to Embodiment 5, when the temperature is raised to 1000° C., piezoelectric resonance and anti-resonance peaks are still observed, indicating that the single crystal can be applied as a high-temperature piezoelectric crystal. The resonant frequency and antiresonant frequency of the sample appear at 881.8 kHz and 887.8 kHz respectively.

Embodiment 9

After orienting the $Sr_3Y(PO_4)_3$ single crystal prepared in Embodiment 5 with reference to the physical piezoelectric axis, a crystal plate is processed along the X and Y directions of the physical axis, with the thickness in the Z direction, length in the X direction, and width in the Y direction. The crystal plate size is: thickness×width×length=1.0 mm×3.5 mm×10.0 mm, and the crystal face in the thickness direction is plated with a conducting electrode.

Figure 15:
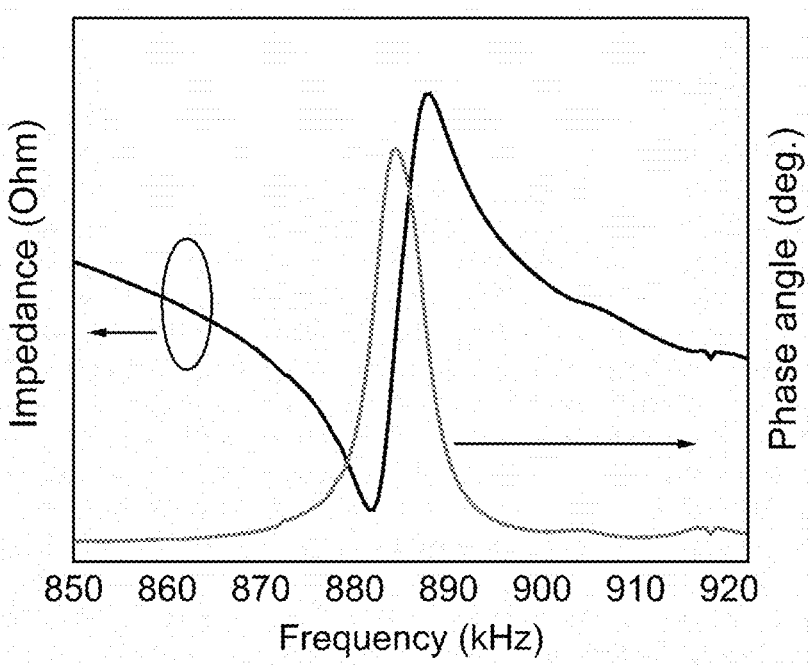
FIG. 15 shows the phase angle plots of the impedance generated by the piezoelectric effect of the $Sr_3Y(PO_4)_3$ single crystal with the ZX cutting orientation in Embodiment 9.
Figure 16:
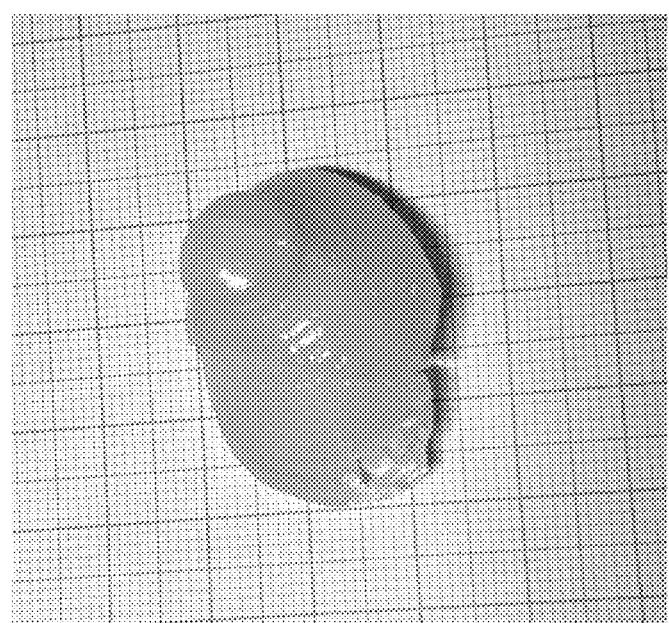
FIG. 16 shows the $Sr_3Y(PO_4)_3$ single crystal in Comparative Example 4.

Upon testing of the crystal plate sample with an impedance analyzer, piezoelectric resonance and anti-resonance peaks are detected, indicating that the single crystal has a piezoelectric effect in the orientation. When the temperature is raised to 1000° C., piezoelectric resonance and anti-resonance peaks are still observed, so the single crystal can be applied as a high-temperature piezoelectric single crystal. The piezoelectric activity of the single crystal, despite the cutting orientations, does not change when the temperature is raised from room temperature to 1000° C. The impedance analysis diagram is shown in FIG. 15.

Embodiment 10

After orienting the $Sr_3Y(PO_4)_3$ single crystal prepared in Embodiment 6 with reference to the physical piezoelectric axes X, Y, and Z, the crystal is rotated θ degrees)(θ=0-180° along the X, Y, and Z axes to prepare $Sr_3Y(PO_4)_3$ single crystal of different cutting orientations. Then, crystal plates are processed with reference to Embodiment 5. The crystal plate size is: thickness×width×length=(0.5-1.5)mm×(3.0-4.0)mm×(8.0-12.0)mm, and the crystal face in the thickness direction is plated with a conducting electrode.

Upon testing of the above series of $Sr_3Y(PO_4)_3$ single crystal plate samples with an impedance analyzer, piezoelectric resonance and anti-resonance peaks are detected, despite the different cutting orientations, indicating that the single crystal has a piezoelectric effect in all orientations of the space. The piezoelectric activity of the single crystal, despite the cutting orientations, does not change even at 1000° C., so it can be applied as a high-temperature piezoelectric crystal.

Embodiment 11. Preparation of Ytterbium Barium Phosphate Single Crystal a. $BaCO_3$, $Yb_2O_3$, and $NH_4H_2PO_4$ are used as raw materials and blended following the stoichiometric proportions according to the chemical formula $Ba_3Yb(PO_4)_3$ of the ytterbium barium phosphate. Then, the $NH_4H_2PO_4$ is further added to exceed the mass percent by 5%.

b. The raw materials well prepared in step (1) are evenly mixed and placed in an aluminum oxide crucible for the first sintering; the sintering temperature is maintained at 900° C. and constant for 10 hours to decompose and remove the $CO_2$, $NH_3$, and $H_2O$; after the first sintering, the raw materials are cooled down, ground, and evenly mixed; then, they are pressed into blocks and placed in the aluminum oxide crucible for solid-phase reaction; the sintering temperature is maintained at 1250° C. and constant for 48 hours to obtain the ytterbium barium phosphate polycrystalline material.

c. The ytterbium barium phosphate polycrystalline material synthesized in step (2) is placed in the iridium crucible of a single crystal growing furnace; before that, the furnace has been evacuated and filled with nitrogen as protective gas to prevent the oxidation of the iridium crucible; the polycrystalline material is heated up with the medium-frequency induction heating method till melting; it is cooled down to coagulate after melting thoroughly and then heated up again to fully melt; this process is repeated three times to drain the bubbles from the melt; then, the melt is overheated 20° C. for 1 hour to obtain the homogeneously melted ytterbium barium phosphate melt.

d. An iridium rod is used as the seed crystal and immersed slowly into the polycrystalline melt in step (3) to have the top of the crystal perpendicular to and just in contact with the melt for single crystal growth.

The technological conditions of the single crystal growth are as follows: the growth temperature is 1800° C.; the pulling rate during necking of the seed crystal is 1-3.5 mm/h, and the rotation rate is 6-12 r/min; after the diameter of the seed crystal is narrowed to 1 mm, the single crystal begins to be cooled down slowly at 0.5° C./h for shouldering; during the shouldering, the pulling rate is reduced to 0.3-0.5 mm/h, and the rotation rate is 6-8 r/min; when the shoulder diameter reaches the desired size (15 mm), the crystal is heated up or cooled down at the rate of 0.3° C./h to perform constant diameter growth, during which the pulling rate is 0.5 mm/h and the rotation rate is 5 r/min; after the single crystal grows to the required size of about a 30 mm height, the crystal starts to be extracted. The extracting process is as follows: first, the temperature is raised at the rate of 15° C./h, and when the bottom of the crystal has a tendency of inward shrinkage, the pulling rate is increased to 5 mm/h to pull the crystal away from the melt. After extracting, the crystal is maintained at a constant temperature in the thermal field for 1 h and then cooled down at a rate of 10-30° C./h to room temperature to obtain the ytterbium barium phosphate single crystal.

(5) After being taken out, the crystal is placed in a high-temperature resistance furnace for annealing treatment at 1300° C. The time of annealing is 48 hours so that the thermal stress generated during the growth of the $Ba_3Yb$ $(PO_4)_3$ single crystal can be fully released.

Figure 17:
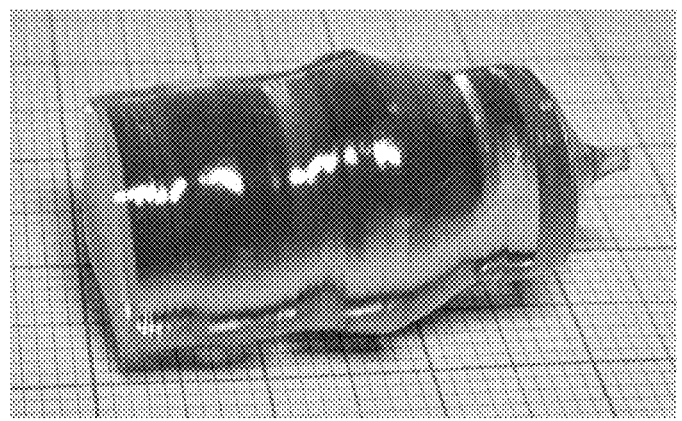
FIG. 17 shows the picture of the $Ba_3Yb(PO_4)_3$ single crystal grown in Embodiment 11.
Figure 18:
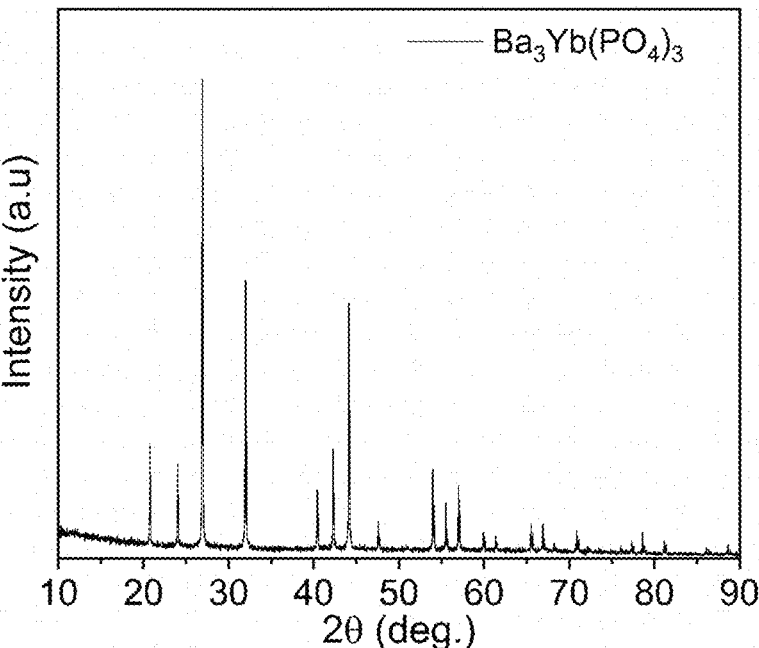
FIG. 18 shows the X-ray diffraction spectrogram of the $Ba_3Yb(PO_4)_3$ single crystal in Embodiment 11.

The picture of the $Ba_3Yb(PO_4)_3$ single crystal obtained is shown in FIG. 17. The X-ray diffraction spectrum of the crystal obtained shows characteristic peaks at 2θ=26.93°, 31.99° and 44.10°, as shown in FIG. 18.

Figure 19:
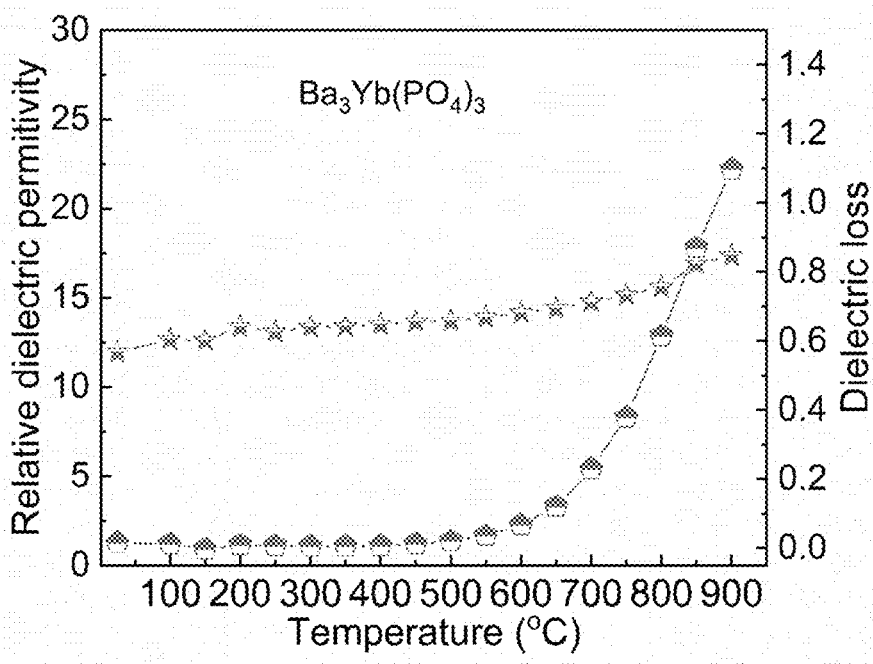
FIG. 19 shows the dielectric spectrum of the $Ba_3Yb$ $(PO_4)_3$ single crystal in Embodiment 11.
Figure 20:
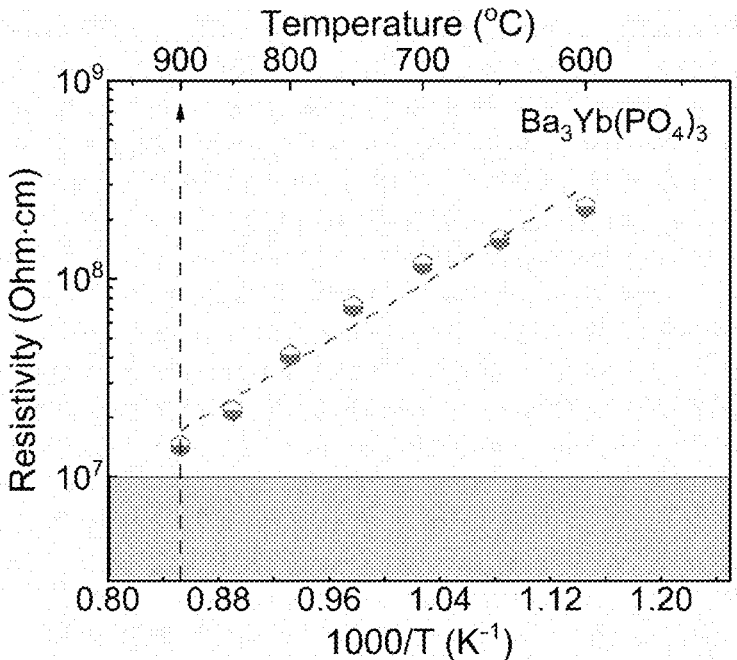
FIG. 20 shows the resistivity plot of the $Ba_3Yb(PO_4)_3$ single crystal in Embodiment 11.

The dielectric spectrum and resistivity characteristics of the $Ba_3Yb(PO_4)_3$ single crystal are shown in FIG. 19 and FIG. 20. It has both low dielectric losses (<1.1) and high resistivity ($\rho > 10^7$ (Ohm·cm)) at 900° C., indicating that it has potential applications in the high-temperature piezoelectric field.

What is claimed is:

1. A piezoelectric single crystal with the general formula of $M_3RE(PO_4)_3$, wherein the $M_3RE(PO_4)_3$ is selected from the group consisting of $Ba_3Yb(PO_4)_3$ and $Ca_3Gd(PO_4)_3$; the piezoelectric single crystal is of a non-centrosymmetric structure and belongs to the −43m point group of the cubic crystal system.

2. The piezoelectric single crystal according to claim 1, wherein structure parameters of the piezoelectric single crystals are as follows:
  a $Ba_3Yb(PO_4)_3$ single crystal: the −43m point group of the cubic crystal system; I-43d space group; lattice parameters: a=b=c=10.459 Å; density=5.149 g/cm³; and
  a $Ca_3Gd(PO_4)_3$ single crystal: the −43m point group of the cubic crystal system; I-43d space group; lattice parameters: a=b=c=9.857 Å; density=3.9 g/cm³.

3. The piezoelectric single crystal according to claim 1, wherein the piezoelectric single crystal is prepared by the following steps:
  (i) weighing and adding $MCO_3$, $RE_2O_3$, and phosphorous compound according to the general formula $M_3RE$ $(PO_4)_3$; further adding 1.5-10% of the phosphorus compound by weight;

grounding and mixing the $MCO_3$, $RE_2O_3$, and phosphorous compound for a first sintering at 800° C.-950° C. for 10 to 15 hours to obtain a first sintering mixture; cooling down, grounding, and mixing the first sintering mixture; pressing the first sintering mixture into round cake-like blocks for a second sintering at 1200-1400° C. for 24 to 48 hours to obtain $M_3RE(PO_4)_3$ polycrystalline material;

(ii) placing the $M_3RE(PO_4)_3$ polycrystalline material in an iridium crucible of a single crystal growing furnace with the protective gas nitrogen or argon; heating and melting the $M_3RE(PO_4)_3$ polycrystalline material with the medium-frequency induction heating method; cooling down to coagulate; and heating and melting again; repeating cooling down, heating and melting for several times to drain the bubbles; then, overheating 10-20° C. for 0.5-2 hours to obtain the homogeneously melted $M_3RE(PO_4)_3$ melt; and iii ) placing an iridium rod or an $M_3RE(PO_4)_3$ crystal in the homogeneously melted $M_3RE(PO_4)_3$ melt for single crystal growth at 1800-1950° C.; pulling rate during necking of the seed crystal: 1-8 mm/h; pulling rate during shouldering: 0.2-1 mm/h; pulling rate while performing constant diameter growth: 0.5-1 mm/h; extracting a desired size of the piezoelectric single crystal.

4. The said piezoelectric single crystal according to claim 3, wherein after extracting, the crystal is maintaining the piezoelectric single crystal at a constant temperature for 0.5-1 h in the thermal field and then cooling down at a rate of 5-30° C./h to room temperature to obtain the piezoelectric single crystal; annealing the piezoelectric sing crystal 1200-1400° C. for 24-48 hours after the piezoelectric single crystal is taken out from the single crystal growing furnace.

5. The piezoelectric single crystal according to claim 3, wherein in the step i), the phosphorous compound is $NH_4H_2PO_4$ or $P_2O_5$; the total mass of the phosphorus compound is to exceed its mass percent by 3-6%.

6. The piezoelectric single crystal according to claim 3, wherein in the step ii), a volume fraction of the nitrogen or inert gases is 90-95%; in step iii), the single crystal growth undergoes four stages: necking, shouldering, performing constant diameter growth, and extracting crystal; during the necking stage, the pulling rate is controlled between 1 and 8 mm/h; after the diameter of the seed crystal is narrowed to 0.5-2.0 mm, the single crystal begins to be cooled down slowly at 0.5-5° C./h for shouldering; during the shouldering stage, the pulling rate is reduced to 0.2-1 mm/h; when the shoulder diameter reaches the desired size, the crystal is heated up or cooled down at the rate of 0-5° C./h and maintained at the temperature of 1800-1950° C. to perform constant diameter growth; after being pulled to the desired height, the crystal starts to be extracted.

7. The piezoelectric single crystal according to claim 3, wherein technological conditions of extracting the piezoelectric single crystal are as follows: the temperature is raised slowly at the rate of 10-30° C./h; when the bottom of the crystal has a tendency of inward shrinkage, the pulling rate is increased to 5-20 mm/h to pull the crystal away from the melt.

* * * * *